Figure 1:
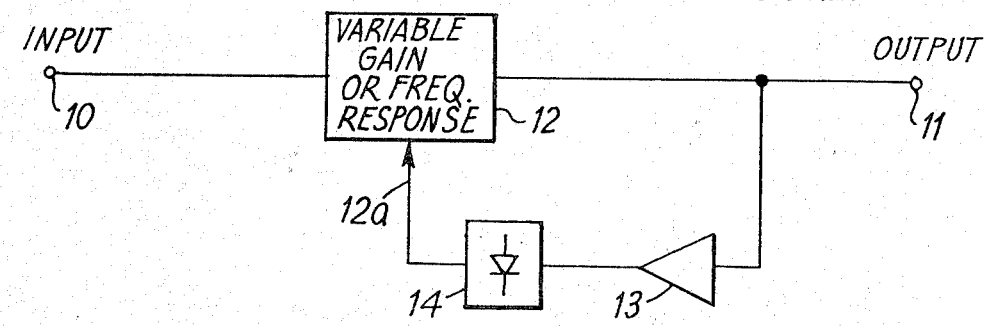

United States Patent [19]

Gundry

[11] 4,001,732
[45] Jan. 4, 1977

[54] CALIBRATION OSCILLATORS FOR NOISE REDUCTION SYSTEMS

[75] Inventor: Kenneth James Gundry, London, England

[73] Assignee: Dolby Laboratories, Inc., San Francisco, Calif.

[22] Filed: Apr. 9, 1975

[21] Appl. No.: 566,315

Related U.S. Application Data

[63] Continuation of Ser. No. 434,507, Jan. 18, 1974, abandoned.

[30] Foreign Application Priority Data

Jan. 23, 1973 United Kingdom ............... 3497/73

[52] U.S. Cl. .................................. 333/14; 330/109; 330/141; 330/145; 331/44; 331/59; 331/135; 331/183

[51] Int. Cl.² ...................... H04B 1/64; H03B 5/00

[58] Field of Search .......... 331/44, 59, 108 D, 135, 331/182, 183; 330/109, 112, 141, 145; 333/14

[56] References Cited

UNITED STATES PATENTS

| | | | |
|---|---|---|---|
| 3,012,197 | 12/1961 | Peterson et al. | 331/44 X |
| 3,324,415 | 6/1967 | Sheffet | 331/59 X |
| 3,500,246 | 3/1970 | Werner | 331/183 X |
| 3,806,832 | 4/1974 | Channing et al. | 331/108 D X |

Primary Examiner—Paul L. Gensler
Attorney, Agent, or Firm—Robert F. O'Connell

[57] ABSTRACT

In a signal compressor wherein an amplified and smoothed control signal is employed to control a variable gain or variable impedance device, a switch is provided to connect a positive feedback loop across the control signal amplifier, thereby to place the compressor in an oscillator mode for providing an alignment or calibration signal of stable amplitude.

3 Claims, 11 Drawing Figures

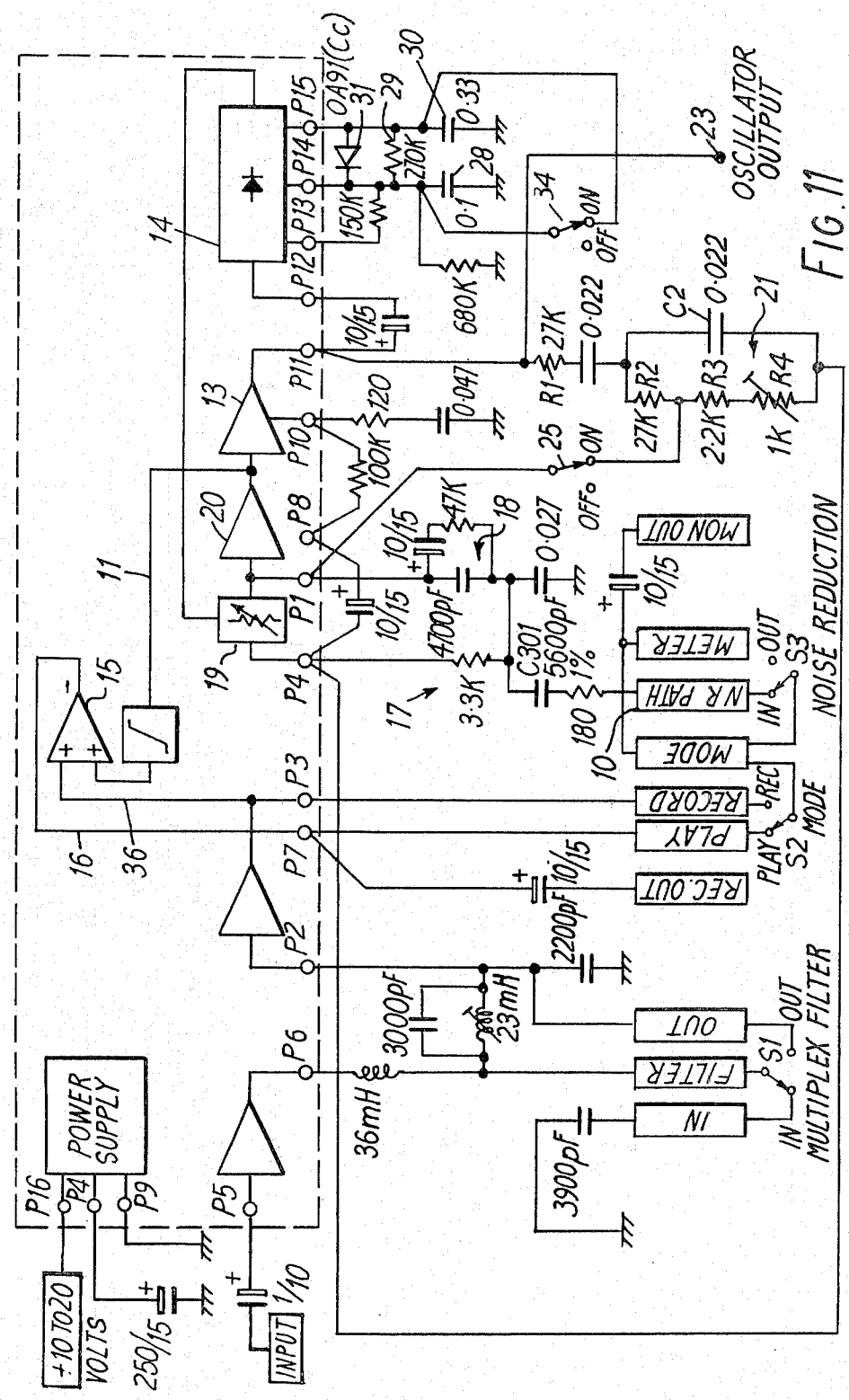

CALIBRATION OSCILLATORS FOR NOISE REDUCTION SYSTEMS

This is a continuation of application Ser. No. 434,507, filed on Jan. 18, 1974, now abandoned.

The present invention relates to noise reduction systems and concerns improvements to compressors for such systems. The invention is particularly, but not exclusively, applicable to the compressors of audio noise reduction systems.

Such systems are described in:

1. U.S. Continuation Application Ser. No. 397,159 filed 13th Sept., 1973 now abandoned.
2. U.S. Application Ser. No. 395,562 filed 10th Sept., 1973 now U.S. Pat. No. 3,903,485, as a Continuation of Ser. No. 227,144 filed 17th Feb., 1972, now abandoned.
3. U.S. Pat. No. 3,631,365.
4. U.S. Application Ser. No. 432,171, filed 10th Jan. 1974, now abandoned as a Continuation of U.S. Application Ser. No. 232,113 filed 6th Mar., 1972, now abandoned.

The present invention is based upon a circuit for modifying the dynamic range of an input signal, comprising a signal channel, a variable gain or variable impedance device arranged to vary the gain or frequency response of the signal channel so as to effect compression of the dynamic range of the input signal, and amplifying means and rectifying and smoothing means coupled to the signal channel downstream of the variable gain or variable impedance device to derive a control signal which controls the variable gain or variable impedance device.

In some known circuits, the said signal channel is the sole channel operating upon the input signal. In other circuits, described in references (1), (2) and (3) for example, the said signal channel sets as a limiting (strongly compressing) channel and the output thereof is added to a signal in a main channel (which has dynamic range linearity) to create an overall compression characteristic. In still further circuits, the signal channel operates in a series mode as described in reference (4).

The variable gain or variable impedance device may vary the gain of the signal channel directly to effect dynamic range modification. Alternatively, the said device may vary the frequency response of the channel, thereby indirectly to vary the gain, as described inter alia in reference (3). The present invention is applicable to all the variants described in this and the preceding paragraph.

Complementary audio noise reduction systems (i.e. ones which compress the dynamic range of signals before recording or transmission, and expand complementarily afterwards) require adjustment of channel gain before they will work properly in all circumstances. This adjustment is rendered easier if an alignment or calibration signal can be generated by a built-in oscillator, which must have a stable output amplitude. The provision of such an oscillator represents an undesirable additional expense, especially in equipment intended for the domestic market. The object of the present invention is to enable the additional expense to be very much reduced.

The invention is characterized by a switch operable to place the circuit in an oscillator mode by coupling a positive feedback loop from the output to the input of the amplifying means.

Developments of the invention are hereinafter described and defined by the sub-claims.

Figure 2:
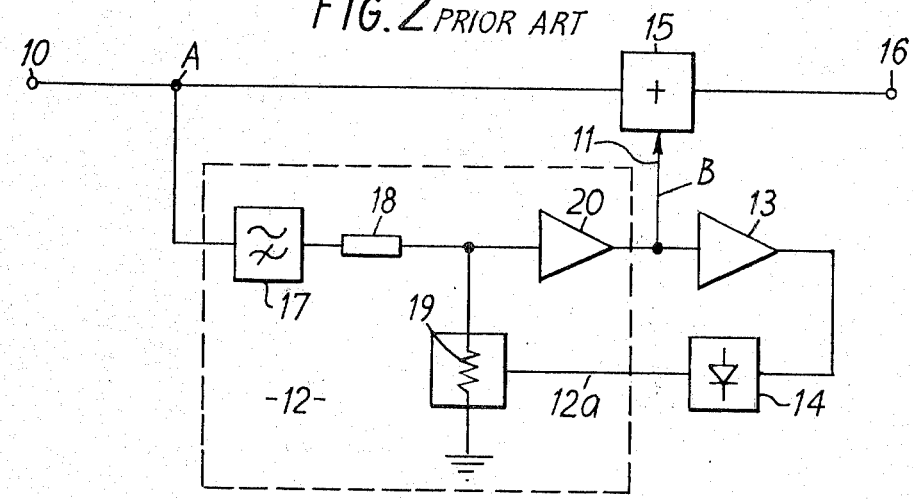
Figure 3:
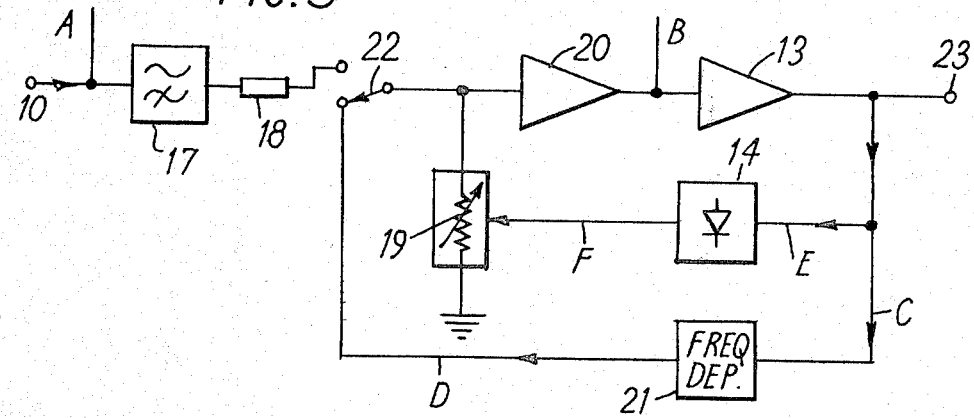
Figure 4:
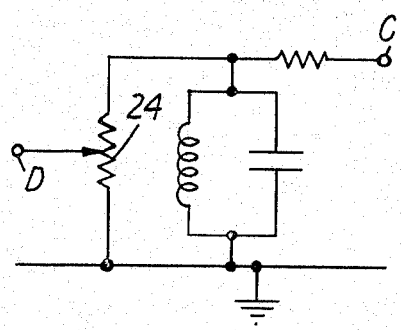
Figure 5:
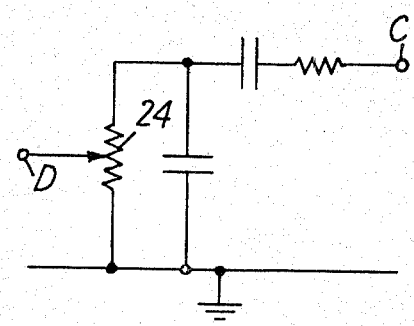
Figure 6:
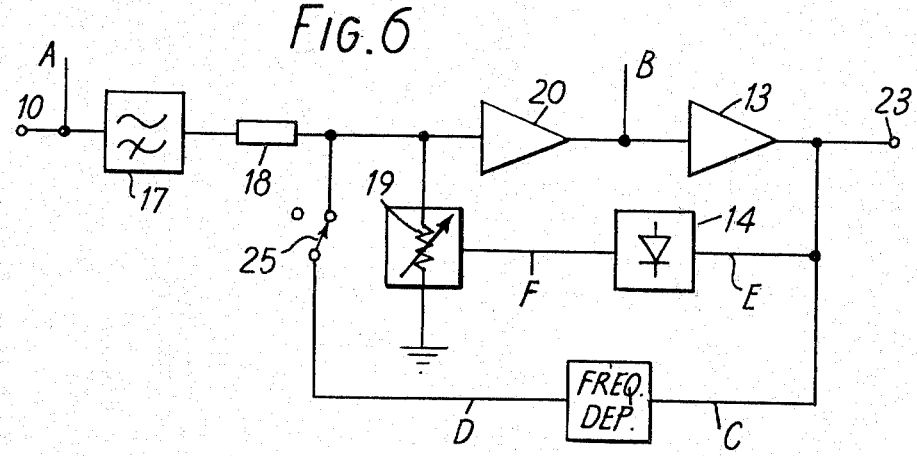
Figure 7:
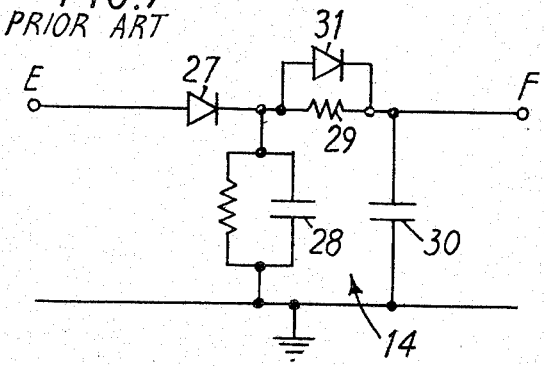

The invention will be described in more detail, by way of example, with reference to the accompanying drawings, in which:

FIG. 1 shows a known circuit for varying the dynamic range of a signal,
FIG. 2 shows the circuit of a known compressor,
FIG. 3 shows an embodiment of the present invention derived from FIG. 2,
FIGS. 4 and 5 show frequency dependent networks for use in the circuit of FIG. 3,
FIG. 6 shows a modification of the embodiment of FIG. 3,
FIG. 7 shows a known rectifying and smoothing circuit for the circuit of FIG. 2,
FIGS. 8, 9 and 10 show modifications of the circuit of FIG. 7 for use in the embodiments of the invention shown in FIGS. 3 and 6, and
FIG. 11 shows the practical circuit of an embodiment of the invention operable either as compressor or expander.

In FIGS. 2 to 10 capital letters denote corresponding points of the circuits and in FIGS. 3, 6, 8, 9 and 10 switches are shown in the oscillator mode position.

FIG. 1 shows the general form of a known signal channel for modifying the dynamic range of an input signal applied to an input terminal 10. The modification is effected by a variable gain or variable frequency response circuit 12 connected between the input terminal 10 and an output terminal 11. The circuit 12 includes a variable gain or variable impedance which is so controlled as to provide the required variation in gain or frequency response. The control signal on line 12a for the variable device, which may be a voltage or current signal depending on the nature of the device, is derived by means of an amplifier 13 and a rectifying and smoothing circuit 14, the amplifier deriving its input from the output of the circuit 12. To apply the invention to this circuit, a positive feedback loop is switched into circuit with the amplifier 13.

FIG. 2 shows a compressor circuit of the nature disclosed in in reference (3) in which the channel of FIG. 1 operates as a so-called further path to provide a signal component which is added, by a combining circuit 15, to a main signal component provided with dynamic range linearity from the terminal 10, the compressed output signal being provided at terminal 16 by the output of the circuit 15.

With reference to the terminology used in reference (2), the circuit of FIG. 2 is a Type 1 compressor. The modifications thereof to create a Type 2 compressor (to which the present invention is also applicable) will be apparent from reference (2).

The circuit 12 is shown in more detail as comprising a band-restricting filter 17 (e.g. a high pass filter) followed by a series impedance 18 and a shunt, variable impedance 19 which will typically be a variable, semiconductor resistance device. An amplifier 20 provides the signal to terminal 11 and to the amplifier 13. Impedances 18 and 19 act as a controlled attenuator (variable gain device) or as a variable filter, the latter as described in reference (3).

FIG. 3 shows the further path or limiter section between points A and B with the addition of a block 21 containing a frequency dependent network which can be switched into circuit by means of a switch 22 to provide feedback round amplifiers 20 and 13, and hence oscillation at a frequency determined by the nature of the network 21. As shown, the oscillator output is taken from the output of the amplifier 13 via a terminal 23, but an output may of course be taken from any point round the feedback loop.

If the two amplifiers 20 and 13 together are phase inverting, then at the required frequency of oscillation, the network 21 must also be inverting, for example a phase-shift network. If conversely the amplifiers are together non-inverting, the network 21 must also be non-inverting at the required oscillation frequency, for example a tuned circuit or a Wien bridge network.

FIGS. 4 and 5 illustrate examples of the network 21 using a tuned circuit and a Wien bridge network respectively. In both cases a potentiometer 24 provides a means of adjusting the oscillator output level as required.

In FIG. 3 the switch 22 is a changeover switch which also breaks the connection from the impedance 18 to the amplifier 20. However, it is possible to make the output impedance of the network 21 small compared with the value of the impedance 18 at the required frequency of oscillation, and it then becomes unnecessary to disconnect impedance 18 when the oscillator is switched on. FIG. 6 shows FIG. 3 modified to provide simplified switching, the change-over switch 22 being replaced by a single make-contact switch 25.

In circuits for modifying the dynamic range of an input signal, the smoothing of the rectified control signal, occurring in block 14 of FIGS. 1, 2, 3 and 6, may employ a variable time constant to provide for rapid adjustment of the variable gain or variable impedance device when the input signal level changes abruptly, while maintaining a longer time constant when the signal changes more slowly. For example, in the circuit of FIG. 2, it is desirable to provide rapid limiter attack times for large and abrupt increases in signal level while maintaining long attack times under less demanding signal conditions. FIG. 7 shows the circuit configuration employed in one type of circuit manufactured by and under license from Dolby Laboratories, Inc., in which the signal from amplifier 13 is rectified by a diode 27 and charges a capacitor 28. This change is in turn transferred to a capacitor 30 on a long time constant via a resistor 29 when the difference in potentials on the two capacitors 28 and 30 is less than the forward conduction voltage of a diode 31, and on a shorter time constant when the difference in potentials on the capacitors is sufficient to cause conduction in the diode 31.

Figure 8:
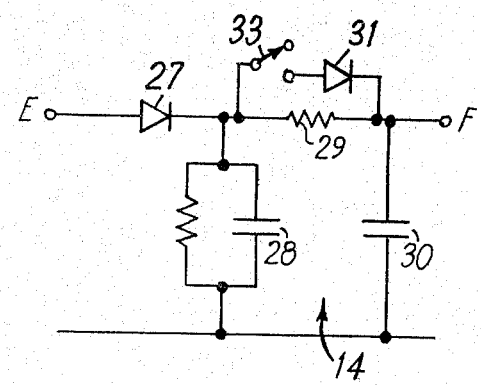
Figure 9:
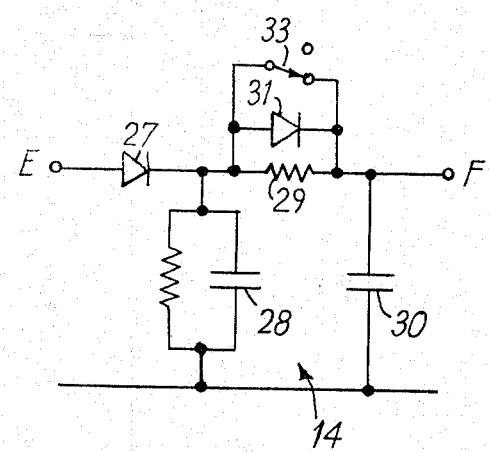
Figure 10:
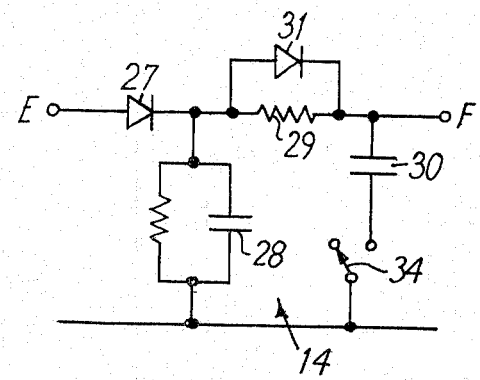

When the extra components to convert the dynamic range modifying circuit to an oscillator are switched into circuit, the variable time constant system sometimes leads to intermittent oscillation ("squegging"), and it is then necessary to modify the smoothing characteristics of the circuit 14 to eliminate the rapid attack. FIGS. 8, 9 and 10 illustrate three of the numerous possible methods. In FIGS. 8 and 9 the "speed-up" diode 31 is open- and short-circuited respectively by a switch 33, while in FIG. 10 the capacitor 30 is disconnected by a switch 34. The switch 33 or 34 is ganged with the switch 22 or 25.

FIG. 11 shows the complete circuit diagram of an integrated circuit noise reduction processor as incorporated in domestic tape recorder equipment, with the few added components required to convert the processor to an oscillator producing a stable amplitude (usually 580 mV r.m.s.) at a frequency of approximately 400 Hz. The integrated circuit shown in the broken line rectangle is available under Signetics type number NE 545B for use in a switched compressor/expander known as the B-type processor of Dolby Laboratories Inc. The integrated circuit pins are given the numbers 1 to 16 prefixed with the letter P. The complete circuit represents a combination of FIGS. 5, 6 and 9 and corresponding reference numerals have been applied to FIG. 11.

Commenting briefly on the known part of the circuit S1 switches a multiplex filter in and out of circuit, the filter being required when processing a signal carrying an FM stereo multiplex tone. Switch S2 selects either the REC (record) mode in which the circuit is in the Type 1 compressor configuration of FIG. 6 or the PLAY (playback) mode in which the circuit is in the Type 1 expander configuration. In this configuration it will be seen that the input 10 to the limiter channel is connected to the output of the adding amplifier 15 and the signal at the output 11 of the limiter channel decreases the main signal provided via line 36 since the amplifier 15 is inverting. Switch S3 is used to open-circuit the input to the limiter channel when it is desired to switch out the noise reduction action.

The only components added to enable the circuit to act as a calibration oscillator are the ganged switches 25 and 34 and the resistors and capacitors R1 to R4, C1 and C2 forming the Wien bridge network 21. The resistors R2, R3 and R4 together correspond to the resistor 24 of FIG. 5 and R4 is adjustable to preset the level of the calibration oscillator output signal.

This method of providing an alignment oscillator for use during the calibration of the noise reduction processors in conjunction with associated equipment is very much more economical than the building of a completely separate oscillator circuit.

What I claim is:

1. In a signal compressor for compressing the dynamic range of an input signal, comprising a signal channel, a variable gain means arranged to vary the gain of the signal channel at least within a restricted frequency band, so as to effect compression of the dynamic range of the input signal amplifying means and rectifying and smoothing means coupled to the signal channel downstream of the variable gain means to derive a control signal, and means applying the control signal to the variable gain means to reduce the said gain in response to increase of input signal level, the improvement comprising a selectively operable positive feedback circuit, and a first switch having a first connection mode for normal operation of the compressor and a second connection mode operable to render ineffective the input signal to the compressor and to place the circuit in an oscillator mode by coupling the positive feedback circuit from the output to the input of the amplifying means to establish a closed positive feedback loop, and an oscillator output terminal coupled to a point in the positive feedback loop, the parameters of the positive feedback circuit being such that a signal is provided at the output terminal in the oscillator mode, with a stable amplitude such as to provide a calibration signal at a predetermined level within the operating range of the compressor, for feeding to a recording or transmission channel for the purpose of adjusting the channel gain, for proper complementary expansion of signals compressed by said compressor when said switch is in said first connection mode, the rectifying and smoothing means including a circuit causing the rectifying and smoothing means normally to respond more rapidly to abrupt changes in signal level than to non-abrupt changes, and comprising a further switch operative with the first switch to render the last said circuit inoperative in the oscillator mode, thereby to render the speed of response uniform for all signal changes.

2. A circuit according to claim 1, wherein the rectifying and smoothing means comprise a first smoothing circuit feeding a second smoothing circuit having a longer time constant than the first smoothing circuit, and a diode arranged to conduct when the difference between the smoothed voltages provided by the first and second smoothing circuits exceeds the forward conduction voltage of the diode and, when conductive to reduce the time constant of the second smoothing circuit, and wherein the further switch open circuits the diode so that the second smoothing circuit operates with its long time constant regardless of the said difference.

3. A circuit according to claim 1, wherein the rectifying and smoothing means comprise a first smoothing circuit feeding a second smoothing circuit having a longer time constant than the first smoothing circuit, and a diode arranged to conduct when the difference between the smoothed voltages provided by the first and second smoothing circuits exceeds the forward conduction voltage of the diode and, when conductive to reduce the time constant of the second smoothing circuit, and wherein the further switch disables the second smoothing circuit.

* * * * *